United States Patent
Schuh et al.

(10) Patent No.: US 6,528,927 B1
(45) Date of Patent: Mar. 4, 2003

(54) PIEZO ACTUATOR WITH MULTI-LAYER CONDUCTIVE FILM, AND METHOD FOR MAKING SAME

(75) Inventors: Carsten Schuh, Baldham (DE); Karl Lubitz, Ottobrunn (DE); Dieter Cramer, Graz (AT); Thorsten Steinkopff, Eglharting (DE); Iris Hahn, Neubiberg (DE); Andreas Wolff, Munich (DE); Clemens Scherer, Gilching (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/606,750

(22) Filed: Jun. 29, 2000

(30) Foreign Application Priority Data

Jun. 29, 1999 (DE) .......................... 199 29 687

(51) Int. Cl.⁷ .......................... H01L 41/08; H01L 41/22
(52) U.S. Cl. .................................. 310/328; 310/366
(58) Field of Search .......................... 310/328, 364, 310/366, 346; 29/25.35

(56) References Cited

U.S. PATENT DOCUMENTS

| | | | | |
|---|---|---|---|---|
| 4,221,986 A | * | 9/1980 | Besson | 310/344 |
| 4,411,052 A | | 10/1983 | Kümpf | 29/25.35 |
| 4,561,286 A | * | 12/1985 | Sekler et al. | 73/24.06 |
| 5,038,068 A | * | 8/1991 | Kushida et al. | 310/334 |
| 5,302,880 A | * | 4/1994 | Kaida | 310/370 |
| 5,510,663 A | * | 4/1996 | Van Loenen | 310/179 |
| 5,767,612 A | * | 6/1998 | Takeuchi et al. | 310/324 |
| 6,239,534 B1 | * | 5/2001 | Takeuchi et al. | 310/328 |
| 6,294,859 B1 | * | 9/2001 | Jaenker | 310/328 |
| 2002/0084444 A1 | * | 7/2002 | Sakata et al. | 310/328 |

FOREIGN PATENT DOCUMENTS

| | | |
|---|---|---|
| DE | 196 48 545 | 1/1998 |
| DE | 195 15 488 | 6/1998 |

OTHER PUBLICATIONS

Derwnet abstract for DE 197 15 488 C1.*

* cited by examiner

Primary Examiner—Lynn Field
Assistant Examiner—Michael C. Zarroli
(74) Attorney, Agent, or Firm—Young & Thompson

(57) ABSTRACT

A piezo actuator with an actuator body has at least one electrically conductive multi-layer film with a rigid electrical terminal element. The multi-layer film controls expansion and attraction of the actuator body. An electrical conduction layer of the multi-layer film has at least one recess to increase flexibility. The recesses in the conduction layer are, for example, photolitho-graphically produced.

6 Claims, 4 Drawing Sheets

PIEZO ACTUATOR WITH MULTI-LAYER CONDUCTIVE FILM, AND METHOD FOR MAKING SAME

BACKGROUND OF THE INVENTION

1. Field of the Invention

The present invention is directed to a piezo actuator of the type having an actuator body and an electrically conductive multi-layer film for a control of expansion and contraction of the actuator body, wherein the multi-layer film has at least one carrier layer, at least one electrical conduction layer and at least one rigid electrical terminal element.

2. Description of the Prior Art

A piezo actuator of the above general type is disclosed, for example, in German PS 197 15 488.

A piezo actuator is constructed, for example, of a number of piezo elements arranged to form a stack-like actuator body. Each piezo element is composed of a piezo-ceramic layer that is provided with metallic electrodes on both sides. When an electrical voltage is applied to these electrodes, which are referred to as inner electrodes, then a surface charge of the piezo-ceramic layer changes. The piezo-ceramic layer reacts to this change of the surface charge with a lattice distortion (piezo-effect). As a result of the lattice distortion, the piezo element, and thus the actuator body expands and contracts in a direction that is defined by the arrangement of the piezo-ceramic layer and the electrodes of a piezo element. A usable change of the dimensions of the stack-like actuator body occurs in conformity with the amount of the expansion and contraction.

German PS 197 15 488 discloses such a piezo actuator having an actuator body in monolithic multi-layer structure. The actuator body is formed by at least one stack of alternating electrodes and piezo-ceramic layers. An electrode layer serves as electrode (inner electrode) for each neighboring piezo-ceramic layer. An electrical contacting of the electrode layers in an alternating polarity ensues for this purpose. The alternating polarity is achieved by means of two outer electrodes. Each outer electrode is formed by a metallization strip and an electrically conductive multi-layer film. An metallization strip is applied to a lateral surface of the actuator body. It thereby extends over a height that is determined by the electrically active layers of the actuator body stacked on top of one another. One metallization strip is electrically conductively connected to every other electrode layer and is electrically insulated from every first electrode layer lying therebetween. In contrast, the second metallization strip is insulated from every other electrode layer and is electrically conductively connected to every first electrode layer. Electrical insulation of an electrode layer relative to a metallization strip is achieved by a recess in the electrode layer. The electrode layer does not extend fully up to the lateral surface of the actuator body to which the metallization strip is attached. Such a region of the actuator body is referred to as piezoelectrically inactive region of the actuator body.

In order to assure the electrical contacting of every individual electrode layer, voltage supply to a metallization strip in the known piezo actuator ensues via a strip-like, electrically conductive multi-layer film in the form of a plastic film laminated with copper. The multi-layer film is thereby soldered to a metallization strip at an edge. The multi-layer film extends over the entire height of the electrically active layers of the actuator body. An outside edge of the multi-layer film facing away from the actuator body is connected to an rigid electrical terminal element. If a tear occurs in a metallization strip, it is electrically bridged by the multi-layer film. As a result, the piezo actuator exhibits a high cycle number, and thus a long service life. A cycle is a one-time expansion and contraction of the piezo actuator or of the actuator body.

SUMMARY OF THE INVENTION

An object of the present invention is to provide a piezo actuator that exhibits an improved electrical contacting compared to known piezo actuators and thus a higher number of cycles and longer service life.

This object is achieved in a piezo actuator according to the invention having an actuator body and an electrically conductive multi-layer film for control of expansion and contraction of the actuator body, wherein the multi-layer film has at least one carrier layer, at least one electrical conduction layer and at least one rigid electrical terminal element. In the multi-layer film the electrical conduction layer has at least one recess. As used herein, "recess" is a generic term which includes, inter alia, depressions, holes, gaps, thinned regions, or any type of intentionally produced removal of material in a localized area of the electrical conduction layer.

As described above, the multi-layer film can be indirectly connected to the inner electrodes of the actuator body via a metallization strip, however, the multi-layer film also can be directly arranged at the inner electrodes. For example, the multi-layer film can be soldered to the inner electrodes. The electrical terminal element serves for electrical contacting of the electrical conduction layer of the multi-layer film. For example, it is soldered to an edge of the multi-layer film facing away from the actuator body so that the terminal element projects beyond the multi-layer film. The terminal element can also be directly applied on a surface of the conduction layer.

Due to the expansion and contraction of the actuator body, mechanical stresses occur in an outer electrode that is secured to the actuator body in the direction of the expansion and contraction. These mechanical stresses can lead to a tear in the outer electrode. Such a tear can occur not only in a metallization strip, but also can occur in an electrically conductive metallization strip, or can continue into the multi-layer film proceeding from the metallization strip. The tear can expand further during the course of operation of the piezo actuator and lead to a failure of the piezoelectrical actuator. As a result, an entire outer electrode with metallization strip and multi-layer film can be separated and the piezo actuator can thus fail.

The basis of the invention is to minimize the mechanical stresses in an electrically conductive multi-layer film during the operation of the piezo actuator. These mechanical stresses are especially large, for example, when a tear has arisen in the piezoelectrically inactive region of the actuator body due to a polarization of the piezo actuator (polarization tear). A relatively large change of the expanse of the actuator body occurs in the expansion and contraction given such a tear. High mechanical stresses occur in the multi-layer film due to this large change, particularly when the multi-layer film is firmly connected to a rigid terminal element. These stresses are reduced with suitable measures.

An electrical conduction layer of the multi-layer film can be, for example, a metal layer. In general, a metal layer is not very flexible and is thus not capable of alleviating mechanical stresses that occur. A particular goal of the invention is therefore to increase the flexibility of the electrical conduction layer.

Above all, the increase in the flexibility is achieved by introducing a recess, or at least a thinned region, into the conduction layer. The conduction layer thus has one or more recesses. For example, each recess can have a diameter that is in the range between 20 and 200 μm. Shape, size, placement and number of the recesses in the conduction layer are designed such that the multi-layer film is, in particular, flexible in the direction of the expansion and contraction of the actuator body.

The recesses in the conduction layer are, in particular, arranged in a contacting region to which the multi-layer film is attached to the actuator body. Especially large tensile and compressive strains occur in such a contacting region during the operation of the piezo actuator. The recesses, however, alternatively can be distributed over the entire conduction layer. They can also be arranged at the rigid electrical terminal element. The important feature is that the stresses proceeding from the contacting region via the multi-layer film up to the electrical terminal element are largely alleviated by the recesses.

In an embodiment, at least one recess in the conduction layer is a blind hole. A blind hole does not completely penetrate the conduction layer. The conduction layer is merely thinned by the hole. In a further embodiment, the conduction layer has at least one hole in the form of a cutout. Here, the hole completely penetrates the conduction layer in the thickness direction.

In a further embodiment of the invention, at least one recess of the conduction layer is a gap. The gap can partially penetrate the conduction layer laterally. In this form, a gap is a slit or trench of the conduction layer, however, the gap can completely penetrate the conduction layer. When a gap completely penetrates the conduction layer in the thickness direction, the conduction layer has electrical conductive webs. Two webs are separated from one another by a gap. Providing many such gaps parallel to one another produces a number of webs parallel to one another. Preferably, a number of gaps are arranged substantially perpendicular to the direction of the expansion and contraction of the actuator body. Alternatively, the gaps can assume an arbitrary angle relative to one another and to the direction of the expansion and contraction of the actuator body. For example, the conduction film can have a fishbone pattern as a result of the gaps.

In another embodiment, the conduction layer has at least one metal selected, in particular, from the group of aluminum, beryllium, cobalt, iron, copper and nickel. In particular, a copper, nickel and/or aluminum base alloy is used. Various steels are likewise suitable. A copper-beryllium alloy or a nickel-beryllium alloy are particularly advantageous. These alloys are distinguished by a high fatigue strength, and thus by a high long-term mechanical stability.

In addition to metals, non-metallic conductors such as, for example, organic conductor materials can be used as the material for the conduction layer.

Two demands are linked to the carrier layer: It should stabilize the conduction layer and simultaneously assure a high flexibility of the entire multi-layer film. To that end, the carrier layer has a deformable material in an embodiment. This deformable material is distinguished, for example, by a low modulus of elasticity. For example, the deformable material of the carrier layer is an elastomer. It is also possible for the carrier layer to be entirely composed of an elastomer.

In another embodiment of the invention, the carrier layer has at least one recess for increasing the flexibility of the multi-layer film. The effect of such a recess is described above.

The carrier layer is preferably composed of an electrically insulating material. The material of the carrier layer and the material of the conduction layer preferably exhibit a similar thermal expansion behavior.

In a further embodiment of the invention, the multi-layer film has a carrier layer of polyimide. This material is distinguished by a low modulus of elasticity in a broad temperature range. For example, a piezo actuator can be employed in a diesel injection system, wherein it is exposed to a temperature in a range from −40° C. through +150° C. The aforementioned carrier layer has high stability and a high flexibility in this temperature range.

Polyurethane is a further elastomer which may be used among many conceivable elastomers.

The carrier layer of the multi-layer film need not necessarily be electrically insulating; it can be electrically conductive.

A large variety of design variations of the multi-layer film with the recesses are conceivable. These design variations can be different dependent on the material of the conduction layer and/or carrier layer and thus can minimize mechanical stresses during operation and during polarization of the piezo actuator as well. For example, these design variations relate to the shape and size of the recesses of the conduction layer, with the goal of minimizing the notch sensitivity of the conduction layer. A reduced notch sensitivity of the conduction layer at a recess results in a crack formation in the conduction layer at the recess being suppressed, or cracks can only occur with difficulty. To that end, for example, one end of a recess can be rounded in the form of a slot. A mechanical stress that counteracts a mechanical stress that occurs during operation of the piezo actuator also can be artificially built up in the conduction layer at the recess. By "reaming", for example, the conduction layer is placed under compressive strain at the recess, thereby reducing tensile stress in the conduction layer during operation of the piezo actuator. In "reaming", a workpiece is plugged into a recess of the conduction layer, this workpiece exhibiting a somewhat larger diameter than the hole itself. The introduction of an artificial stress given a slot ensues, for example, at the ends of the slot.

A multi-layer film can be composed of a number of carrier and/or conduction layers. For example, a conduction layer is arranged between two carrier layers or a carrier layer is arranged between two conduction layers. A multi-layer film with a layer sequence copper-polyimide-copper or polyimide-copper-polyimide is, for example, suitable.

A further embodiment of the invention is directed to a method for manufacturing a multi-layer film with at least one carrier layer and at least one electrical conduction layer for controlling an expansion and contraction of a piezo actuator. The method is particularly suited for the manufacture of a multi-layer film as disclosed above. At least one recess is generated in a conduction layer in this method.

In particular, the recess is produced before the carrier layer and the conduction layer are joined. Standard procedures for a structuring of a thin film are suitable for this purpose. If the recesses are holes, for example, punching the holes is one such method. An etching method is likewise suitable. Recesses also can be, generated by eroding material from the layer using high-energy radiation. A recess in the form of a gap can be cut in the conduction layer. An erosion by sawing or grinding is also possible.

In a further embodiment of the invention, a recess in the conduction layer is implemented after joining the carrier layer and the conduction layer. For example, the carrier layer and the conduction layer can be joined to one another with an adhesive. The multi-layer film produced in this way is subsequently structured, for example in a photolithography process.

In summary, the following advantages are achieved with the present invention:

The recess or recesses in the conduction layer of the electrically conductive multilayer film reduce mechanical stresses in the conduction layer. The probability for the occurrence of a crack in the conduction layer is thereby also reduced.

If a crack nevertheless occurs in the conduction layer, spreading of the crack is impeded or prevented by the recess.

The carrier layer reduces vibrations that occur during the operation of the piezo actuator and can lead to crack-forming mechanical stresses.

The inner electrodes of the actuator body remain electrically contacted during operation of the piezo actuator. A very high number of cycles, and thus along service life of the piezo actuator, result.

Standard methods that are utilized in thin-film technology can be employed for structuring the conduction layer.

DESCRIPTION OF THE PREFERRED EMBODIMENTS

Figure 1A:
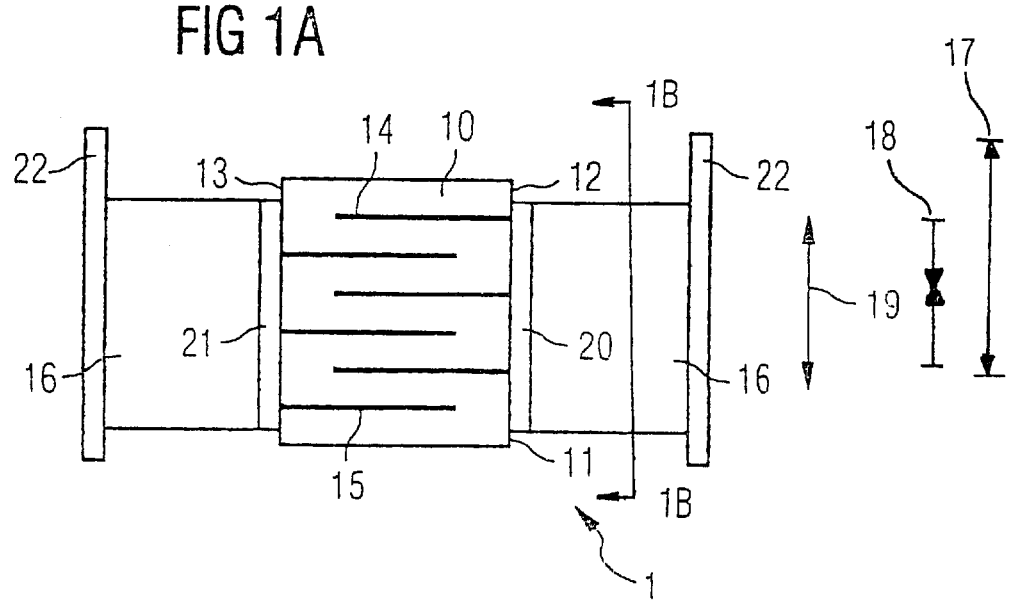
FIG. 1a shows a side view of a piezo actuator composed of an actuator body and two multi-layer films with rigid electrical terminal elements from the side, in accordance with the invention.

The piezo actuator 1 according to FIG. 1a is composed of an actuator body 11 in the form of a stack of piezo-ceramic layers 10 and electrode layers as inner electrodes 14 and 15 arranged therebetween. A piezo-ceramic layer 10 is composed of a PZT material. The material of the inner electrodes 14 and 15 is a silver-containing stoving paste.

Figure 1B:
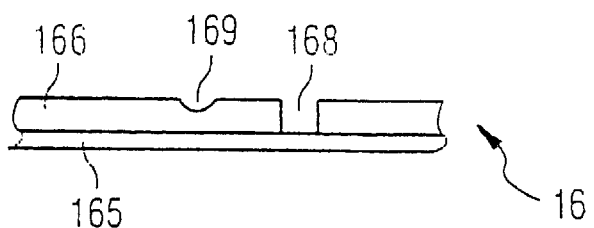
FIG. 1b shows a cross-section through a multi-layer film section of FIG. 1a, in accordance with the invention.
Figure 4:
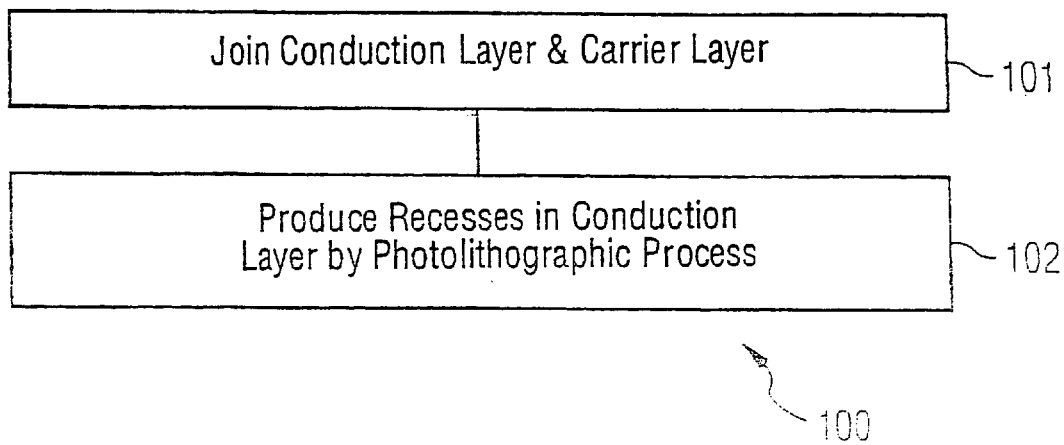
FIGS. 4–5 are flowcharts for methods for manufacturing a multi-layer film in accordance with the invention.

Respective metallization strips 20 and 21 are applied to the two lateral surfaces 12 and 13 of the actuator body 11 parallel to the direction 19 in which the expansion 17 and the contraction 18 of the actuator body 11 occurs. The metallization strips 20 and 21 are composed of a silver stoving paste. Respective electrically conductive multi-layer films 16 are mechanically and electrically conductively connected via solder to the metallization strips 20 and 21 of the surface of the actuator body 11. The connection extends over the height of the electrode layers to be contacted. The multi-layer film 16 is composed of a carrier layer 165 of polyimide and an electrical conduction layer 166 of copper (see FIG. 1b). A rigid electrical terminal element 22 is soldered to each multi-layer film 16. The terminal element 22 is thereby attached to an edge of the multi-layer film 16 facing away from the actuator body 11 and projects beyond both the actuator body 11 as well as the multi-layer film 16.

Figure 2A:
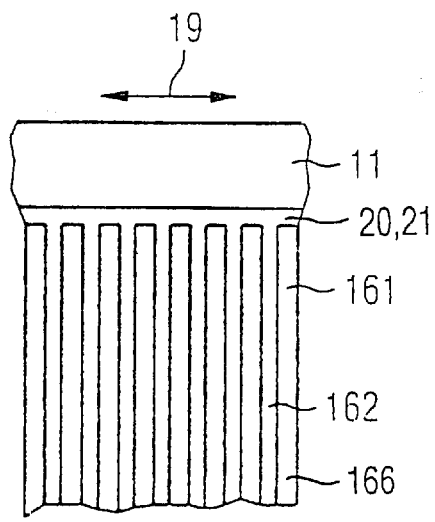
FIGS. 2a–2c show various embodiments of the electrical conduction layer of a multi-layer film in accordance with the invention.

FIG. 2a shows one way of how the conduction layer 166 of the multi-layer film 16 is structured. The recesses 161 are thereby fashioned in the form of gaps parallel to one another. A number of webs 162 parallel to one another result, these being disposed perpendicular to the direction 19 of the expansion 17 and contraction 18 of the actuator body 11.

Figure 2B:
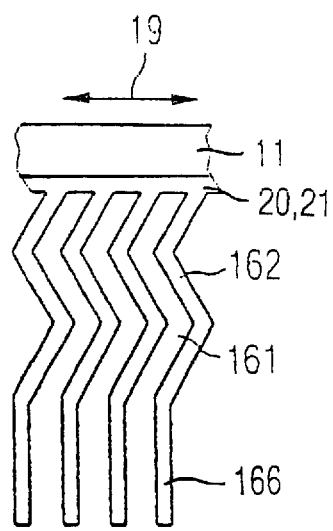

In FIG. 2b, the arrangement of the gaps 161 is such that a fishbone pattern is produced.

Figure 2C:
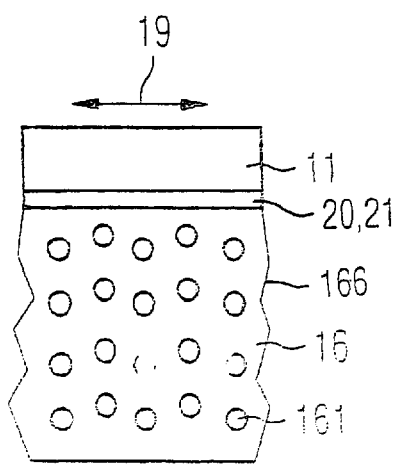

A number of round recesses 161 are introduced into the conduction layer 166 in the embodiment of FIG. 2c.

Figure 3A:
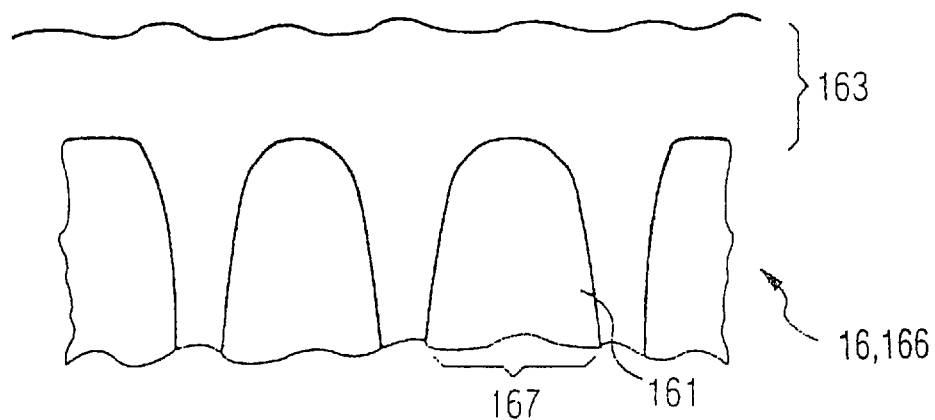
FIGS. 3a–3c respectively show a portion of the multi-layer film at the recesses from above in accordance with the invention.
Figure 3B:
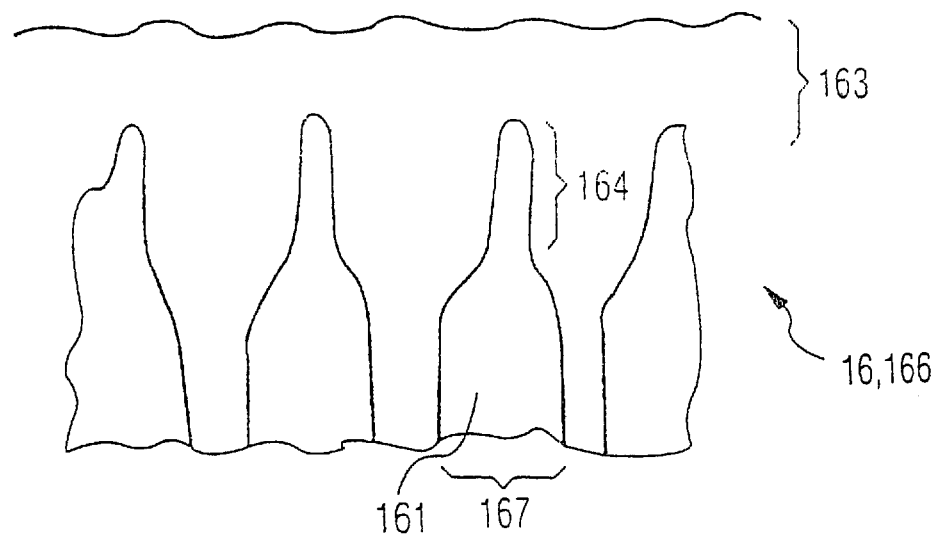
Figure 3C:
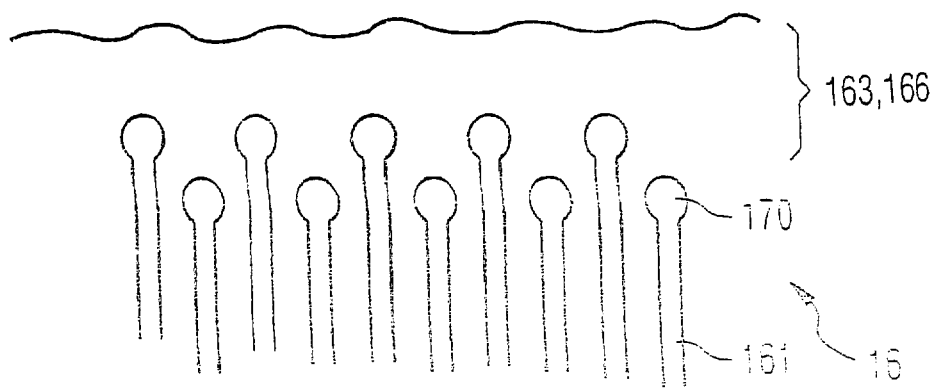
Figure 5:
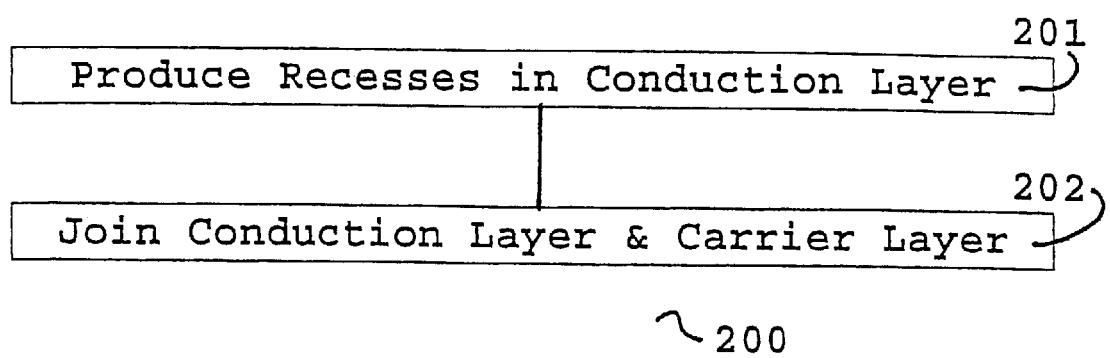

As can be seen in FIGS. 3A–3C, none of the gaps 161 proceeds to the contacting region 163 up to the edge of the conduction layer 166 to which the conduction layer 166 is connected to the inner electrodes, or a metallization strip 20 or 21. Due to this, the gaps only partially penetrate the conduction layer laterally; that is, along the surface extension of the conductive layer. The configuration of a gap 161 at such a location can vary. According to FIG. 3A, the diameter 167 of the gap 161 continuously decreases to a specific final value. In FIG. 3B, the gap 161 has a reduced diameter over a specific length 164 in the contacting region 163. In the embodiment of FIG. 3C, a gap 161 in the contacting region 163 is rounded. The notch sensitivity of the conduction layer 166 is reduced by this rounding 170.

In further embodiments the conduction layer 166 has recesses 161 for minimizing stresses in the region wherein the rigid electrical terminal element 22 is firmly joined to the conduction layer 166.

In further embodiments the recesses are cutouts 168 and/or blind holes 169. A recess in the form of a blind hole is a trench.

The goal of each of these embodiments is to reduce the mechanical stresses in the multi-layer film 16 to a minimum, or to alleviate the mechanical stresses proceeding from the actuator body 11 up to the rigid electrical terminal element 22. The embodiments can differ dependent on the material. Dependence on material means means that the material of the carrier layer 165 as well as the material of the conduction layer 166 contribute to the aforementioned goal. The size of the recesses 161 also contributes dependent on the diameter 167 of the recesses 161, a different design will lead to a minimum of stress energy in the actuator operation.

For manufacture 100 of the multi-layer film 16, the conduction layer 166 and the carrier layer 165 are brought together in a first step 101. The conduction layer 166 is glued onto the carrier layer 165 for this purpose.

The recesses 161 are produced in a second step 102. This occurs in a photolithography process.

For manufacture 200 of the multi-layer film 16, the recesses 161 are produced in a first step 201. This can occur by photolithography. The conduction layer 166 and the carrier layer are brought together in a second step 102, e.g., by gluing.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for manufacturing a piezo actuator comprising:
    providing a piezo actuator body with a multi-layer film having at least one carrier layer, at least one electrical conduction layer and at least one rigid electrical terminal element for controlling expansion and contraction of said actuator body;

producing at least one recess in said conduction layer; and joining said carrier layer and said conduction layer and producing said recess in said conduction layer prior to joining said carrier layer and said conduction layer.

2. A method for manufacturing a piezo actuator comprising:

providing a piezo actuator body with a multi-layer film having at least one carrier layer, at least one electrical conduction layer and at least one rigid electrical terminal element for controlling expansion and contraction of said actuator body;

producing at least one recess in said conduction layer; and joining said carrier layer and said conduction layer and producing said recess in said conduction layer after joining said carrier layer and said conduction layer.

3. A piezo actuator, comprising:

an actuator body formed of a stack of piezo-ceramic layers with interposed inner electrodes;

metallization strips applied to two lateral surfaces of the actuator body, the metallization strips extending over the actuator body parallel to an expansion and contraction direction of the actuator body;

electrically conductive multi-layer films conductively connected at a first edge to the metallization strips; and a rigid electrical terminal connected to a second edge of each of the multi-layer films, each multi-layer film comprising a carrier layer and an electrical conduction layer, the electrical conduction layer comprising parallel recesses running perpendicular to the two lateral surfaces of the actuator body and perpendicular to the expansion and contraction direction of the actuator body.

4. The piezo actuator of claim 3, wherein the recesses form blind holes in the conduction layer.

5. The piezo actuator of claim 3, wherein the recesses form holes proceeding completely through the conduction layer.

6. The piezo actuator of claim 3, wherein the recesses are arranged in a fishbone pattern.

* * * * *